United States Patent [19]

Andricos

[11] Patent Number: 4,598,252
[45] Date of Patent: Jul. 1, 1986

[54] VARIABLE GAIN POWER AMPLIFIER

[75] Inventor: Constantine Andricos, Pasadena, Calif.

[73] Assignee: ITT Corporation, New York, N.Y.

[21] Appl. No.: 628,366

[22] Filed: Jul. 6, 1984

[51] Int. Cl.⁴ .............................................. H03G 3/00
[52] U.S. Cl. .................. 330/51; 330/124 R; 330/277; 330/278; 330/295
[58] Field of Search ...................... 330/51, 129, 124 R, 330/277, 278, 295

[56] References Cited

U.S. PATENT DOCUMENTS 3,525,948 8/1970 Sherer et al. ............... 330/124 R X

FOREIGN PATENT DOCUMENTS 2091054 7/1982 United Kingdom .

Primary Examiner—James B. Mullins
Attorney, Agent, or Firm—T. L. Peterson; J. S. Christopher

[57] ABSTRACT

A power amplifier having plural parallel amplification circuits of different gains selectively actuable to zero and maximum gains, and electronic switches to select a circuit for connection to a common output junction.

3 Claims, 5 Drawing Figures

HIGH EFFICIENCY VARIABLE GAIN POWER AMPLIFIER 22

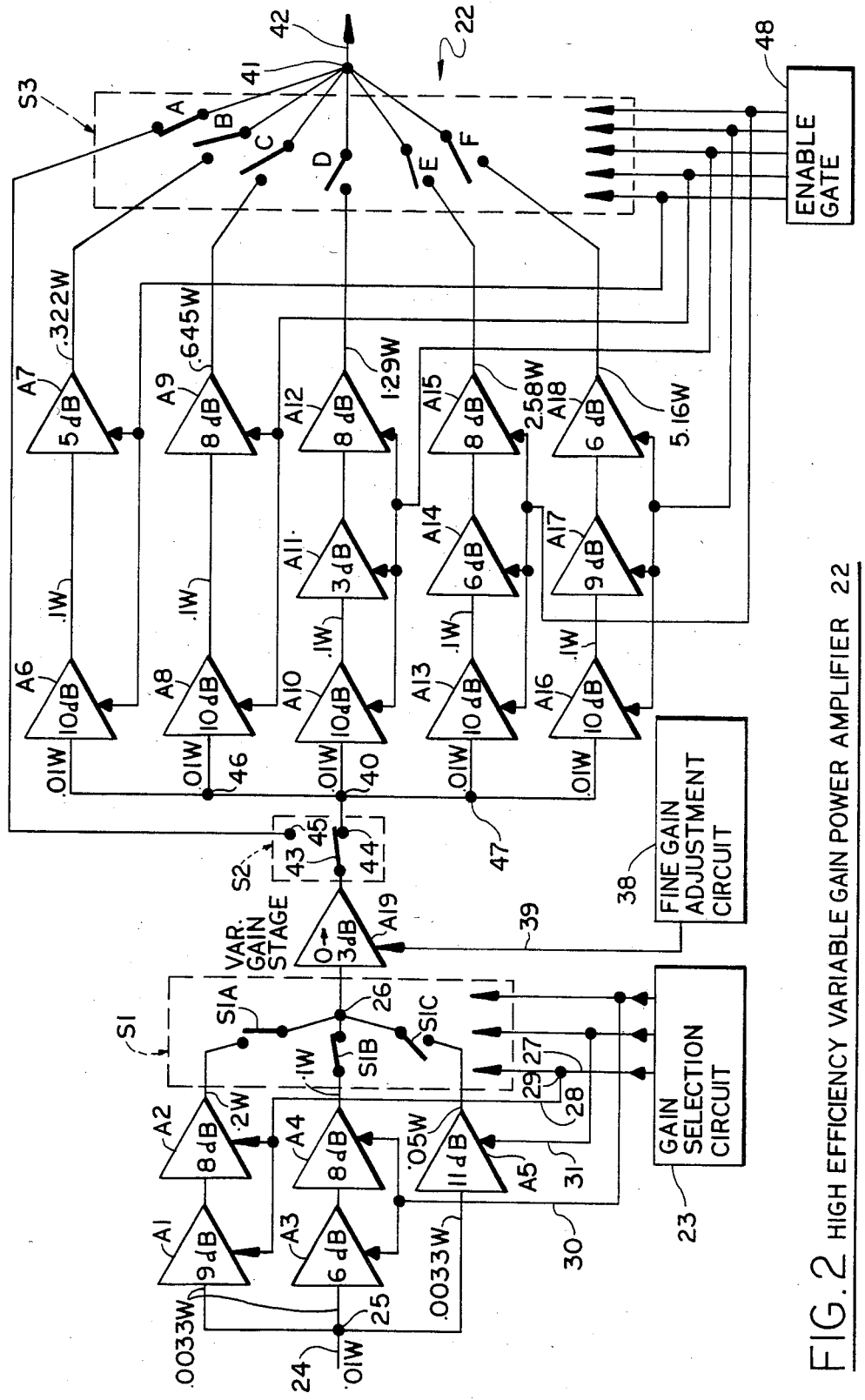
FIG. 2 HIGH EFFICIENCY VARIABLE GAIN POWER AMPLIFIER 22

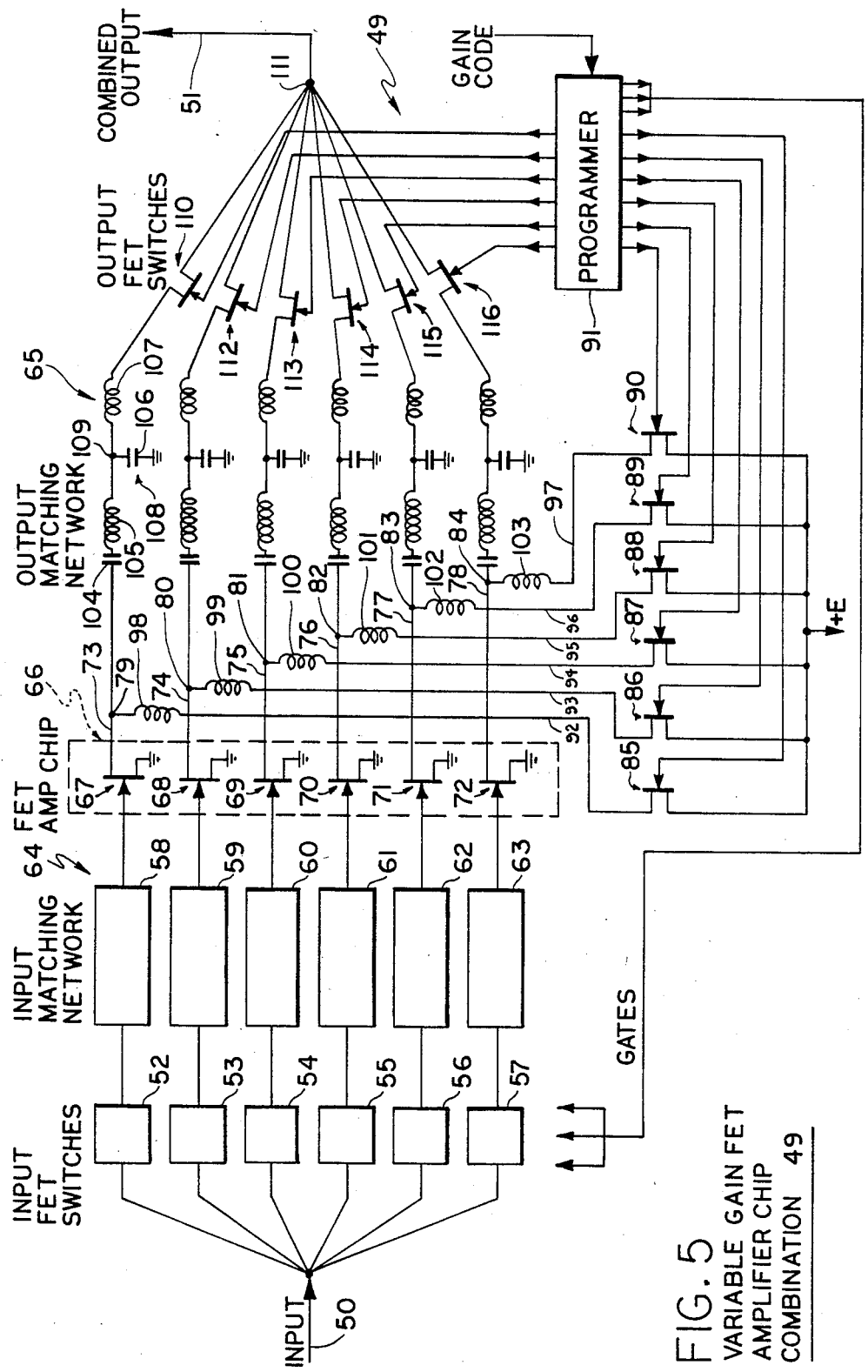
FIG. 5  VARIABLE GAIN FET AMPLIFIER CHIP COMBINATION 49

VARIABLE GAIN POWER AMPLIFIER

BACKGROUND OF THE INVENTION

This invention relates to power amplifiers, and more particularly to high efficiency variable gain power amplifiers.

PRIOR ART STATEMENT

Gain variation in prior art power amplifiers is usually accomplished by using a passive variable attenuator in series with the main power. Prior art power amplifiers have a shortcoming on this account. That is, they have poor efficiency.

SUMMARY OF THE INVENTION

In accordance with the amplifier of the present invention, the above-described and other disadvantages of the prior art are overcome by providing plural parallel paths of amplification, each path being capable of being selectively shut off to improve efficiency.

BRIEF DESCRIPTION OF THE DRAWINGS

In the accompanying drawings which illustrate exemplary embodiments of the present invention:

FIG. 2 is a block diagram of a power amplifier constructed in accordance with the present invention;

FIG. 5 is a schematic diagram of an alternative embodiment of the present invention.

DESCRIPTION OF THE PREFERRED EMBODIMENTS

Figure 1:
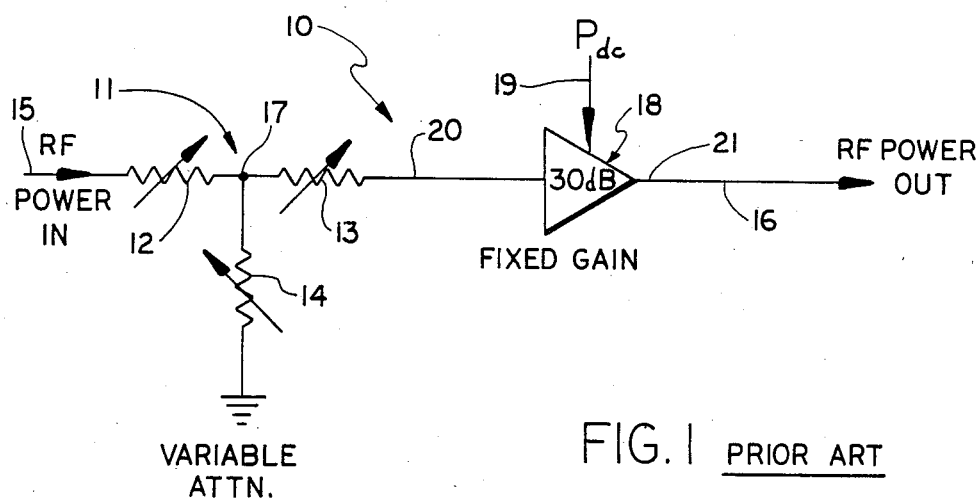
FIG. 1 is a diagrammatic view of a prior art variable gain power amplifier.

A prior art power amplifier is shown at 10 in FIG. 1. Amplifier 10 includes an attenuator 11 having variable resistors 12, 13 and 14.

Amplifier 10 has an input lead 15 and an output lead 16. Variable resistor 12 is connected from input lead 15 to a junction 17. Variable resistor 14 is connected from junction 17 to ground. A thirty decibel amplifier is provided at 18 having a power input on a lead 19 of $P_{dc}$.

Variable resistor 13 is connected from junction 17 to the input of amplifier 18 over a lead 20. Amplifier 18 has an output lead 21 which is connected to output lead 16 of amplifier 10.

As can be seen in FIG. 1, the attenuator 11 takes considerable power from the incoming signal over lead 15 and thus reduces the efficiency of amplifier 10.

In accordance with the present invention, a high efficiency variable gain amplifier is shown at 22 in FIG. 2. Amplifier 22 includes 19 amplifiers A1, A2, A3, A4, A5, A6, A7, A8, A9, A10, A11, A12, A13, A14, A15, A16, A17, A18 and A19.

The amplifiers A1 to A19 have respective gains as follows in decibels of: 9, 8, 6, 8, 11, 10, 5, 10, 8, 10, 3, 8, 10, 6, 8, 10, 9, 6 and 3.

A switch module S1 is provided including switches S1A, S1B and S1C.

A gain selection circuit is provided at 23 connected to amplifiers A1, A2, A3, A4, and A5, and switches S1A, S1B and S1C. Amplifier 22 has an input lead 24 on which an incoming signal of power of 0.01 watt may be provided, for example. Lead 24 is connected to a junction 25. Amplifiers A1, A3 and A5 have inputs connected from junction 25. Switch module S1 has an output junction 26. Switches S1A, S1B and S1C are all connected to junction 26. Further, switches S1A, S1B and S1C are respectively connected from the outputs of amplifiers A2, A4 and A5, respectively.

The output of amplifier A1 is connected to the input of the amplifier A2. The output of amplifier A3 is connected to the input of the amplifier A4. Junction 26 is connected to the input of amplifier A19.

The output of amplifier A6 is connected to the input of amplifier A7. The output of amplifier A8 is connected to the input of amplifier A9. The output of amplifier A10 is connected to the input of amplifier A11. The output of amplifier A11 is connected to the input of amplifier A12. The output of amplifier A13 is connected to the input of amplifier A14. The output of amplifier A14 is connected to the input of amplifier A15. The output of amplifier A16 is connected to the input of amplifier A17. The output of amplifier A17 is connected to the input of amplifier A18.

Gain selection circuit 23 has an output lead 27 connected to a junction 29. A lead 28 is connected from junction 29 to the gain control inputs of amplifiers A1 and A2. The gain of all amplifiers A1 to A19 may be controlled in a known manner. For example, the gain of an amplifier is either full or zero. Alternatively, when zero gain is desired, power to the amplifier is turned off.

In a manner similar to the manner in which gains of amplifiers A1 and A2 are controlled, the gains of the amplifier A3 and A4 are controlled over a lead 30. These gains are controlled by gain selection circuit 23, as before.

The gain of amplifier A5 is controlled over lead 31 by gain selection circuit 23.

Gain selection circuit 23 also determines the open or closed state of switches S1A, S1B and S1C. Gain selection circuit 23 may be conventional and may be operated manually, if desired. Gain selection circuit 23 controls the closure of switches S1A, S1B and S1C.

Figure 3:
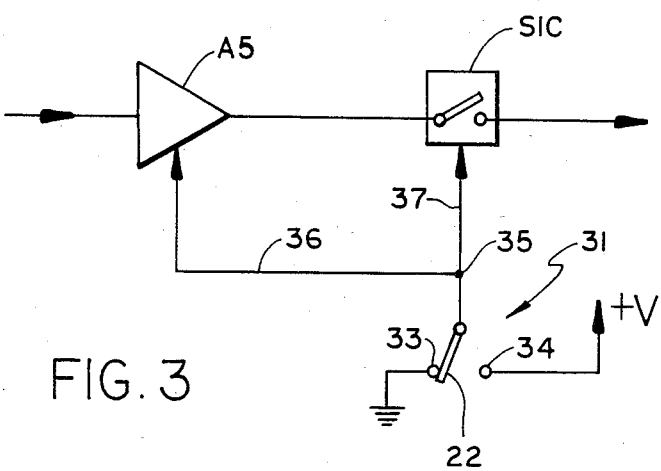
FIG. 3 is a schematic diagram of a switching circuit of a type utilized in a gain selection circuit and enable gate shown in FIG. 2.

Typical operation of gain selection circuit 23 is shown in FIG. 3. Only amplifier A5 is shown to simplify the circuit. Amplifier A5 and switch S1C are both shown in FIG. 3. As indicated, switch S1C is an electronic switch. It is turned on or off simultaneously with the gain of amplifier A5. That is, when switch S1C is closed, the gain of amplifier A5 is 11 decibels. When switch S1C is open, the gain of amplifier A5 is zero. All of this is determined by the state of a switch 32 shown as a single pole, double throw switch having contacts 33 and 34. When the pole is in the position shown, no power is applied to the amplifier A5, its gain is zero and in addition switch S1C is held open. When the pole is in its alternate position, power (+V) is applied to the ampliifer A5, its gain is 11 dB, and the switch S1C is closed. The switch 32 thus symbolically illustrates the function of the gain selection circuit 23.

Junctions 46 and 47 in FIG. 2 are connected to a junction 40. Junction 46 is connected to the inputs of amplifiers A6 and A8. Junction 40 is connected to the input of amplifier A10. Junction 47 is connected to the inputs of amplifiers A13 and A16.

An enable gate 48 is provided which may, if desired, be identical, except for the number of its functions, to gain selection circuit 23. It may, therefore, operate in the manner similar to that described in connection with FIG. 3.

Amplifiers A6 and A7 have their gains turned on and off by enable gate 48. Similarly, so do amplifiers A8 and A9; A10, A11 and A12; A13, A14 and A15; and A16, A17 and A18.

The outputs of amplifiers A7, A9, A12, A15 and A18 are respectively connected to junction 41 via switches A, B, C, D, E and F in switch module S3.

Figure 4:
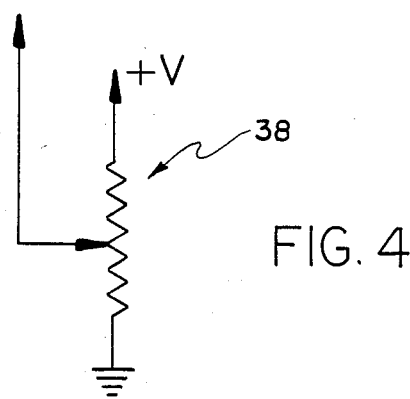
FIG. 4 is a schematic diagram of a fine gain adjustment circuit shown in FIG. 2.

Fine gain adjustment circuit 38 may be as shown in FIG. 4, if desired, to adjust the gain of amplifier A19.

OPERATION

In the operation of the high efficiency variable gain amplifier 22 shown in FIG. 2, fine gain adjustment circuit 38 may be fixed or may be variable with time. The same is true of gain selection circuit 23 and enable gate 48.

If amplifier A5 is turned on, its output will be, for example, 0.05 watt. If amplifier A4 is turned on, the output thereof will be 0.1 watt. If amplifier A2 is turned on, the output thereof will be 0.2 watt. This all assumes an input power of 0.01 watt.

The inputs to each of the amplifiers A6, A8, A10, A13 and A16 may, for example, be 0.01 watt. If so, the outputs of amplifiers A7, A9, A12, A15 and A18 are essentially binary coded with the values shown in FIG. 2. Note that if the output of amplifier A7, when turned on is 0.322 watt, the output of amplifier A9 would be 0.645 watt, the output of amplifier A12 would be 1.29 watt, the output of amplifier A15 would be 2.58 watts, and the output of amplifier A18 would be 5.16 watts.

A high efficiency variable gain amplifier 49 constructed in accordance with the present invention is also shown in FIG. 5 including a FET amplifier chip combination 49.

Combination 49 has an input lead 50 and an output lead 51. Input lead 50 is connected, and the power of the input signal divided among six FET switches 52 to 57.

Sets of matching networks 64 and 65 are provided, both of which may be the same or similar networks. Set 64 includes networks 58 to 63. Networks 58 to 63 are respectively connected from switches 52 to 57.

A FET amplifier chip is provided at 66. Chip 66 includes FET's 67 to 72. These are respectively connected from the outputs of networks 58 to 63.

FET's 67 to 72 have outputs connected from their leads 73, 74, 75, 76, 77 and 78, respectively. Leads 73 to 78 are respectively connected to junctions 79 to 84.

FET's 85, 86, 87, 88, 89 and 90 are connected from a programmer 91 to act as switches for the FET's 67 to 72 in chip 66.

FET's 85 to 90 have sources connected to junctions 79 to 84, respectively, via leads 92 to 97, respectively, and inductors 98 to 103, respectively.

Output matching networks 65 all may be identical or may be different. They all also may have circuit conponents with the same or different component values. For this reason, only the network 65 connected from junction 79 will be described in detail. This network is network 108, including a capacitor 104, an inductor 105, and an inductor 107 connected in series from junction 79 through a junction 109, and a FET 110 to an output junction 111 from which lead 51 is connected. FET's are provided also at 112 to 116. FET 110 and FET's 112 to 116 are controlled by programmer 91 which may or may not be identical to gain selection circuit 23 or enable gate 48 shown in FIG. 2.

Percent efficiency E may be defined as follows:

$$E = \frac{P_o - P_i}{P_{dc}} \times 100$$

where
$P_o$ is RF power out,
$P_i$ is RF power in, and
$P_{dc}$ is the direct-current power.

SUMMARY

General Description

The amplifier of the present invention uses several parallel connected amplifiers whose power outputs vary in a binary scheme. Power attenuation is achieved by gating off successive parallel amplifiers. In this way the gain is adjusted in binary step maintaining high efficiency at low power levels.

Specific Description of How This Invention Overcomes Inefficiency

A block diagram of the proposed variable gain amplifier appears in FIG. 2. The amplifier produces 10 watts output with a gain continuously variable from 0 to 30 decibels. Two clusters of amplifiers are used for control. Amplifiers A6 through A18 is the output amplifier cluster providing up to 10 watts output with 0.05 W input (27 dB gain). The power level is adjustable down from 10 watts in 0.322 watt steps. The input power is split into 5 paths symmetrically feeding a buffer amplifier in each channel. The individual channels are turned on by enable gate 48 which activates the drain voltages for FET's, (collector voltages for transistors). In addition, the output of each active channel is simultaneously connected to the amplifier output through a low loss series switch (S3). The switch isolates the sum output from the unused amplifier output and prevents loading and mismatching. The phase through each channel must be matched for proper summing to occur without degradation. A lumped element combining network is used as part of S3. Amplifier cluster A1 through A5 similarly varies the power level from 0.05 W to 0.35 watts in 0.05 W steps. A variable gain stage A19 consists of a continuously adjustable pad, electronically tunable over 0 to 3 dB range to fine tune the output power.

FET Amplifier Chip Combiner

The same technique is applicable in combining the cells of FET to obtain highly efficient gain variation. FIG. 5 illustrates the technique in a 6-cell FET stage.

Applications

1. Programmable gain of power output for phased array radar elemental transceivers.
2. High efficiency power amplifier in satelite applications.
3. Sonar transmit drivers.
4. Tracking radar transmit drivers.

I claim:

1. A variable gain power amplifier comprising: a plurality of amplifiers of known gain each amplifier having an input and an output; a common input; a common output, said common input being connected to said amplifier inputs, said amplifier outputs being connected to said common output by a plurality of switches, each switch connected from one of said plurality of amplifiers to said common output, said switches being closed to increase the output signal power on said common output by an amount equal to the increase in power delivered by the corresponding amplifier; and gain selection means connected to said amplifiers for selectively reducing the power outputs thereof to zero while opening the ones of said switches connected to amplifiers having their gain reduced to zero.

2. A variable gain power amplifier comprising: first and second common inputs; a common output amplifiers A1, A2, A3, A4, A5, A6, A7, A8, A9, A10, A11, A12, A13, A14, A15, A16, A17, A18 and A19, each having an input, an output and a variable gain control input, said amplifiers A1, A3 and A5 having their inputs connected to said first common input, said amplifiers A2 and A4 having their inputs respectively connected to the outputs of amplifiers A1 and A3; switches S1A, S1B and S1C connected respectively between the outputs of amplifiers A2, A4 and A5 and the input of said amplifier A19: a switch S2 having a pole connected to the output of said amplifier A19, and first and second contacts; first means for rendering the outputs of said amplifiers A1 and A2 zero while rendering said switch S1A open, and vice versa; second means for rendering the output of said amplifiers A3 and A4 zero while rendering said switch S1B open, and vice versa; third means for rendering the output of amplifier A5 zero while rendering said switch S1C open, and vice versa; a gain selection circuit for selectively causing only one of said first, second and third means to be operative to close one of said circuits S1A, S1B and S1C at a time; a fine gain circuit means connected to the variable gain control input of amplifier A19 for fine gain control of amplifier A19, said first contact of switch S2 being connected to said common output via a switch A, and said second contact of switch S2 being connected to said second common input, said second common input being connected to the inputs of said amplifiers A6, A8, A10, A13 and A16, said amplifiers A6 and A7 being connected in cascade to said common output via a switch B, said amplifiers A8 and A9 being connected in cascade to said common output via a switch C, said amplifiers A10, A11 and A12 being connected in cascade to said common output via a switch D, said amplifiers A13, A14 and A15 being connected in cascade to said common output via a switch E, and said amplifiers A16, A17 and A18 being connected to said common output via a switch F; and means connected to all the variable gain control inputs of said amplifiers A6-A7, A8-A9, A10-A11-A12, A13-A14-A15, A16-A17-A18 and said switches A, B, C, D, E and F for rendering selected ones of said amplifier outputs zero when a corresponding one of said switches A–F is open.

3. A variable gain power amplifier comprising: a main input; a main output; a first set of n FET switches connected to said main input; a programmer having a coded gain input to regulate the power gain from said main input to said main output, said programmer having a first set of n outputs to control which of said first set of FET switches is turned on; n input matching networks, said first set of FET switches having outputs connected to respective ones of said n input matching networks; a silicon chip carrying n FET amplifiers connected to respective ones of said matching networks; n output FET switches connected to said main output; and n output matching networks each connected between a corresponding one of said FET amplifiers and a corresponding one of said output FET switches, said programmer having a second set of n outputs to turn on selected ones of said FET amplifiers and a third set of n outputs to turn on selected ones of said output FET switches corresponding to turned on ones of said FET amplifiers.

* * * * *